United States Patent
Hayashi et al.

(10) Patent No.: US 8,637,777 B2
(45) Date of Patent: Jan. 28, 2014

(54) POWER MODULE SUBSTRATE HAVING HEATSINK, METHOD FOR MANUFACTURING THE SAME, POWER MODULE HAVING HEATSINK, AND POWER MODULE SUBSTRATE

(75) Inventors: Hiromasa Hayashi, Okegawa (JP);
Takeshi Kitahara, Gotenba (JP);
Hiroshi Tonomura, Naka-gun (JP);
Hiroya Ishizuka, Koshigaya (JP);
Yoshirou Kuromitsu, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 502 days.

(21) Appl. No.: 12/922,732

(22) PCT Filed: Mar. 11, 2009

(86) PCT No.: PCT/JP2009/054654
§ 371 (c)(1),
(2), (4) Date: Sep. 15, 2010

(87) PCT Pub. No.: WO2009/116439
PCT Pub. Date: Sep. 24, 2009

(65) Prior Publication Data
US 2011/0017496 A1    Jan. 27, 2011

(30) Foreign Application Priority Data

Mar. 17, 2008 (JP) ................ 2008-067344
Sep. 12, 2008 (JP) ................ 2008-234997

(51) Int. Cl.
*H05K 3/36* (2006.01)
*H05K 1/00* (2006.01)

(52) U.S. Cl.
USPC ............................ 174/252; 29/830

(58) Field of Classification Search
USPC ............................ 174/252; 29/830
See application file for complete search history.

(56) References Cited

U.S. PATENT DOCUMENTS 7,529,093 B2 * 5/2009 Sakamoto ............... 361/715
2004/0195294 A1 * 10/2004 Masuda ................... 228/122.1

FOREIGN PATENT DOCUMENTS

| JP | 10-065075 A | 3/1998 |
|---|---|---|
| JP | 10-270596 A | 10/1998 |
| JP | 2004-152971 A | 5/2004 |
| JP | 2007-013028 A | 1/2007 |
| JP | 2007081202 A | 3/2007 |
| JP | 2012146864 A | 8/2012 |
| WO | WO-2007105361 A1 | 9/2007 |

OTHER PUBLICATIONS

Machine translation of JP-2007-81202 A (Yoshio et al) Mar. 29, 2007.*

(Continued)

*Primary Examiner* — Jeremy Norris
(74) *Attorney, Agent, or Firm* — Edwards Wildman Palmer LLP; James E. Armstrong, IV

(57) ABSTRACT

A power module substrate having a heatsink, includes: a power module substrate having an insulating substrate having a first face and a second face, a circuit layer formed on the first face, and a metal layer formed on the second face; and a heatsink directly connected to the metal layer, cooling the power module substrate, wherein a ratio B/A is in the range defined by $1.55 \leq B/A \leq 20$, where a thickness of the circuit layer is represented as A, and a thickness of the metal layer is represented as B.

12 Claims, 5 Drawing Sheets

(56) References Cited

OTHER PUBLICATIONS

Office Action issued for Japanese Patent Application No. 2009-063210 on Jan. 19, 2010.
Notice of Allowance issued for Japanese Patent Application No. 2009-06310 on May 6, 2010.
Notice of Allowance issued for Japanese Patent Application No. 2009-063210 on May 6, 2010.
Notice of Reasons for Rejection, issued in the corresponding Japanese Patent Application No. JP 2010-053620, dated Nov. 20, 2012.
Notice of Allowance, issued in corresponding Japanese Patent Application No. JP 2013-007864, dated Nov. 19, 2013.

* cited by examiner

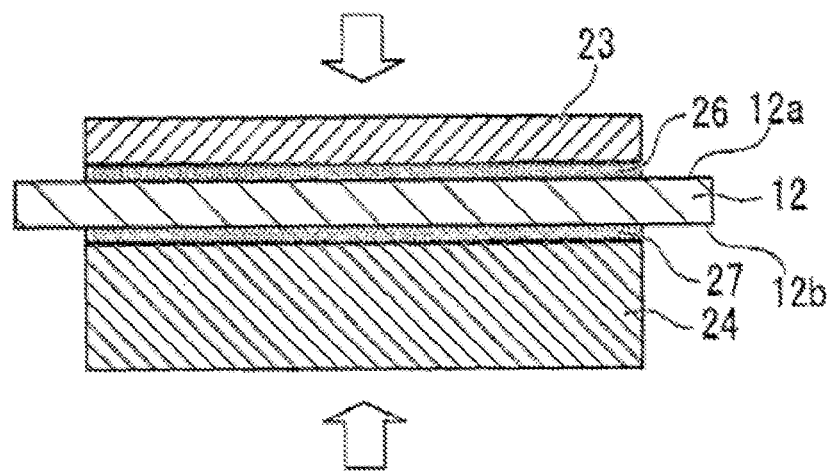
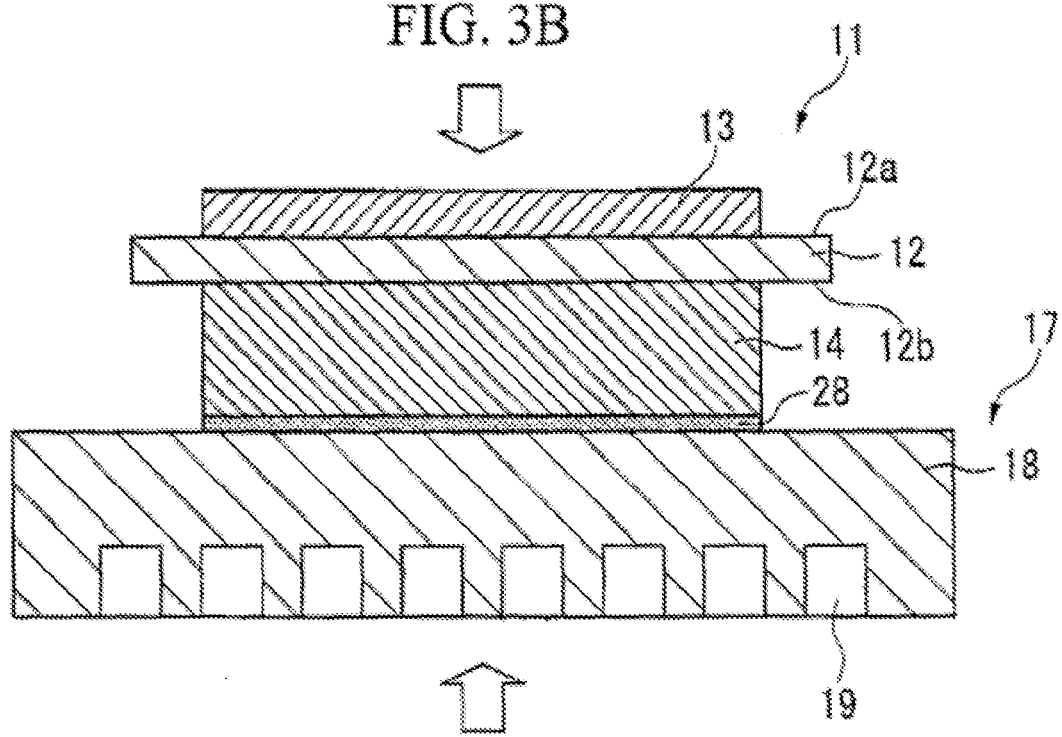

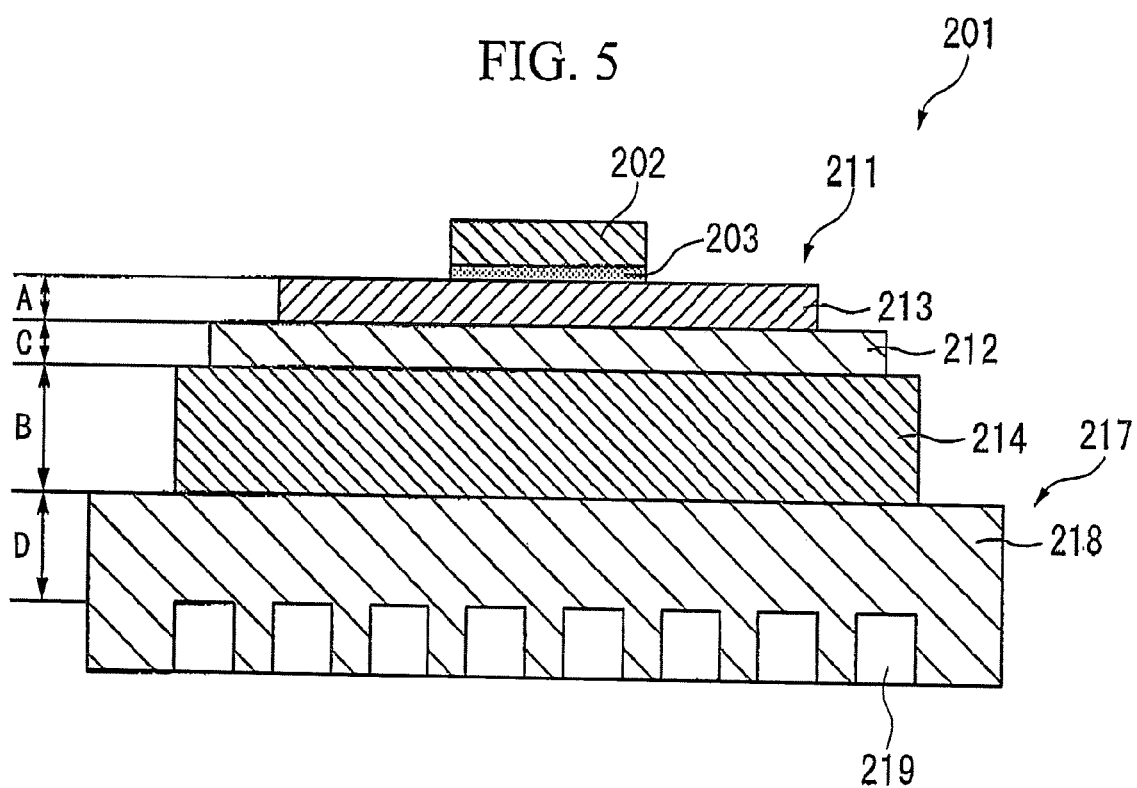

POWER MODULE SUBSTRATE HAVING HEATSINK, METHOD FOR MANUFACTURING THE SAME, POWER MODULE HAVING HEATSINK, AND POWER MODULE SUBSTRATE

BACKGROUND OF THE INVENTION

1. Field of the Present Invention

The present invention relates to a power module substrate having a heatsink, which is employed to a semiconductor device controlling a large amount of electrical current and high voltage, a method for manufacturing the same, a power module having a heatsink, and a power module substrate.

This application is based on and claims priority from Japanese Patent Application No. 2008-67344, filed on Mar. 17, 2008 and Japanese Patent Application No. 2008-234997, filed on Sep. 12, 2008, the contents of which are incorporated herein by reference.

2. Background Art

Conventionally, a power module substrate having a heatsink, which is employed to a semiconductor device controlling a large amount of electrical current and high voltage, is known.

As this kind of the power module substrate, a structure in which a circuit layer composed of aluminum is formed on one face (a first face) of an insulating substrate, a metal layer composed of aluminum is formed on the other face (second face) of the insulating substrate, and a top panel portion of the heatsink is connected to a surface of the metal layer is widely proposed.

The foregoing power module substrate is shown in, for example, Japanese Patent Publication No. 3171234 and Japanese Unexamined Patent Application, First Publication No. H10-065075.

The foregoing power module having a heatsink is manufactured so that the power module substrate is connected to the heatsink, after the power module substrate is formed by connecting the power module substrate, the insulating substrate, the circuit layer, and the metal layer together.

In the power module substrate having a heatsink, electronic components such as a semiconductor chip are connected to the circuit layer by use of a solder.

However, in the above-described power module substrate having a heatsink, if total thickness of the metal layer and the top panel portion of the heatsink which are positioned on the second face of the insulating substrate is small, the bending rigidity thereof is degraded, and warpage may occur thereon.

In recent power modules having a heatsink, the size and thickness thereof have been reduced, but, the amount of heat generated in an electronic component has a tendency to increase.

A heatsink in which the thickness of the top panel portion is small is employed in order to improve the cooling efficiency of the heatsink.

Consequently, the total thickness of the metal layer and the top panel portion of the heatsink which are positioned on the second face of the insulating substrate become small, there is a problem in that the above-described warpage occurs.

In addition, in the power module having a heatsink disclosed in Japanese Patent Publication No. 3171234, a metal layer is connected to a heatsink via aluminum foil, and a melting point lowering layer composed of an Al—Si series brazing filler metal being formed on both faces of the aluminum foil.

Because of this, portions including a great amount of Si and having a high degree of hardness are formed at the joint interface between the aluminum foil and the metal layer and the joint interface between the aluminum foil and the heatsink.

In the case where the portions having a high degree of hardness are formed at the metal layer and the heatsink which are positioned on the second face of the insulating substrate as mentioned above, the metal layer or the top panel portion of the heatsink is restrained at the portions having a high degree of hardness.

For this reason, for example, when the power module substrate is connected to the heatsink, even if a pressure is applied in the stacking direction thereof, the metal layer is restrained by the portions having a high degree of hardness, it is not sufficiently deformed, and warpage cannot be suppressed.

SUMMARY OF THE INVENTION

The present invention was conceived in view of the above-described circumstances and it is an object thereof to provide a power module substrate having a heatsink, a method for manufacturing the same, and a power module having a heatsink, in which it is possible to suppress the occurrence of warpage.

In order to solve the foregoing problems and achieve the object, a power module substrate having a heatsink of a first aspect of the present invention, includes: a power module substrate having an insulating substrate having a first face and a second face, a circuit layer formed on the first face, and a metal layer formed on the second face; and a heatsink directly connected to the metal layer, cooling the power module substrate.

Where the thickness of the circuit layer is represented as A, and the thickness of the metal layer is represented as B, the ratio B/A is in the range defined by $1.5 \leq B/A \leq 20$.

In the structure of the power module substrate having a heatsink, the ratio B/A is in the range defined by $1.5 \leq B/A \leq 20$ as described above, namely, the thickness of the metal layer connected to the heatsink is greater than the thickness of the circuit layer.

By employing this structure, even if a heatsink in which the thickness of the top panel portion is small is used, it is possible to relatively increase the total thickness of the metal layer and the top panel portion of the heatsink which are positioned on the second face of the insulating substrate, and it is possible to suppress the occurrence of warpage.

In addition, since a thick metal layer is directly connected to the heatsink, when the power module substrate is connected to the heatsink, it is possible to sufficiently deform the metal layer by applying a pressure on the power module substrate and the heatsink in the stacking direction thereof, and it is possible to suppress warpage.

Here, if the ratio B/A of the thickness B of the metal layer to the thickness A of the circuit layer is less than 1.5, it is not possible to sufficiently obtain the above-described effect.

In contrast, if the ratio B/A of the thickness B of the metal layer to the thickness A of the circuit layer exceeds 20, the metal layer makes thermal resistance, and cooling by the heatsink does not become sufficient.

Consequently, it is preferable that the ratio B/A of the thickness B of the metal layer to the thickness A of the circuit layer be in the range defined by $1.5 \leq B/A \leq 20$.

In addition, in the present invention, it is preferable that the metal layer be composed of aluminum having a purity of 99.99% or more, before being connected to the heatsink.

By employing this structure, the deformation resistance of the metal layer is small, it is possible to sufficiently deform the metal layer by applying a pressure when the metal layer is connected to the heatsink, and it is possible to reliably suppress the occurrence of warpage.

A method for manufacturing a power module substrate having a heatsink of a second aspect of the present invention, includes: preparing an insulating substrate having a first face and a second face, and a heatsink; connecting a circuit layer to the first face of the insulating substrate, and connecting a metal layer to the second face of the insulating substrate, thereby forming a power module substrate (first connecting step); and stacking the heatsink on the power module substrate in layers, and connecting the heatsink to the metal layer of the power module substrate by applying pressure of 0.15 to 3 MPa in a stacking direction (second connecting step).

In the method for manufacturing the power module substrate having a heatsink having the structure, in the second connecting step in which the above-described power module substrate is connected to the heatsink, since the pressure of 0.15 to 3 MPa is applied in the stacking direction thereof, the metal layer is sufficiently deformed, therefore, it is possible to suppress the occurrence of warpage.

A power module having a heatsink of a third aspect of the present invention includes: the above-described power module substrate having a heatsink; and an electronic component mounted on the circuit layer of the power module substrate having a heatsink.

According to the power module having a heatsink, having this structure, warpage deformation is suppressed, it is possible to significantly improve the reliability thereof even if the usage environment thereof is strict, for example, a usage environment where stress is repeatedly generated.

A power module substrate of a fourth aspect of the present invention includes: an insulating substrate having a first face and a second face; a circuit layer formed on the first face; and a metal layer formed on the second face.

The ratio B/A of the thickness B of the metal layer to the thickness A of the circuit layer is in the range defined by $1.5 \leq B/A \leq 20$.

In the structure of the power module substrate, in the case where the heatsink is connected to the surface of the metal layer, even if a heatsink in which the thickness of the top panel portion is small is used, it is possible to relatively increase the total thickness of the metal layer and the top panel portion of the heatsink which are positioned on the second face of the insulating substrate, and it is thereby possible to suppress the occurrence of warpage.

According to the present invention, it is possible to provide a power module substrate having a heatsink, a method for manufacturing the same, a power module having a heatsink, and a power module substrate, in which it is possible to suppress the occurrence of warpage.

BRIEF DESCRIPTION OF THE DRAWINGS

FIGS. 3A and 3B are schematic cross-sectional views illustrating a method for manufacturing a power module substrate having a heatsink of the embodiment of the present invention.

FIG. 5 is a schematic cross-sectional view showing the structure of a power module having a heatsink, in which a power module substrate having a heatsink of the other embodiment of the present invention is employed.

DESCRIPTION OF THE PREFERRED EMBODIMENTS

Figure 1:
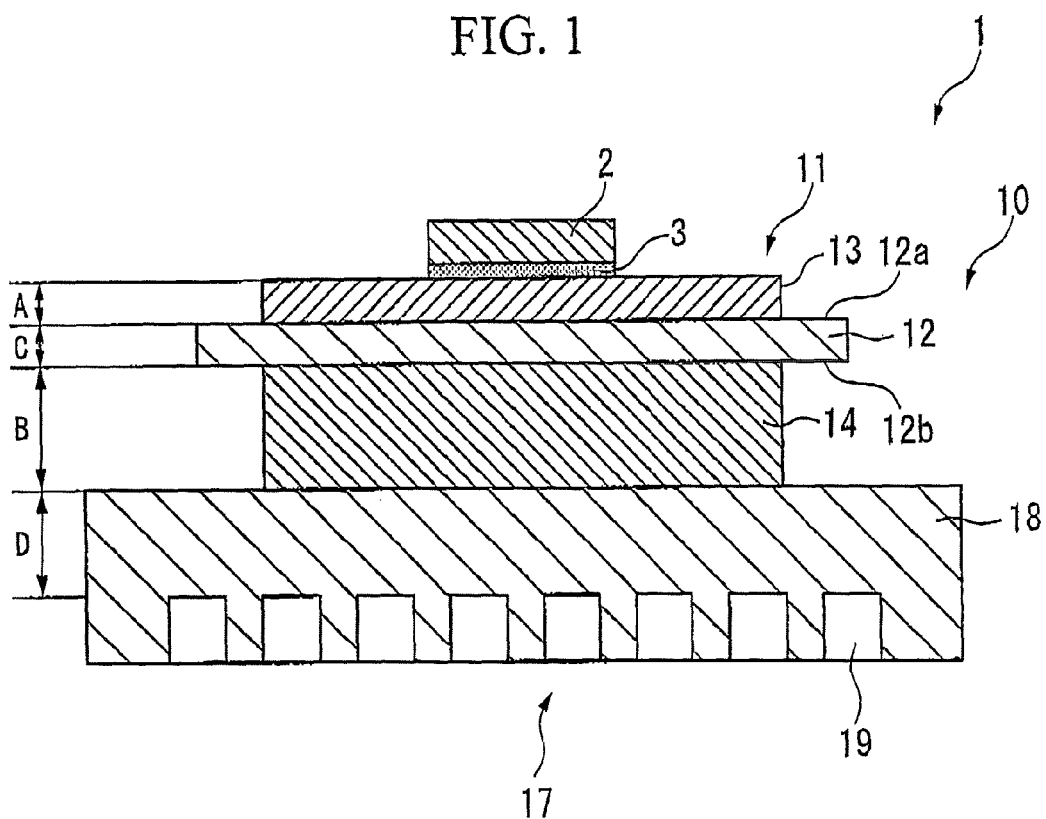
FIG. 1 is a schematic cross-sectional view showing a structure of a power module having a heatsink of embodiment of the present invention, in which a power module substrate having a heatsink is employed.

Hereinafter, an embodiment of the present invention will be described with reference to attached drawings.

FIGS. 1 to 3B show a power module substrate having a heatsink and a power module having a heatsink of the embodiment of the present invention.

The power module 1 having a heatsink is provided with a power module substrate 11 in which a circuit layer 13 is disposed, a semiconductor chip 2 to which the surface of the circuit layer 13 is connected via a solder layer 3, and a heatsink 17.

Here, the solder layer 3 is made of, for example, Sn—Ag series, Sn—In series, or Sn—Ag—Cu series solder material.

In addition, in the embodiment, Ni-plated layer (not shown) is provided between the circuit layer 13 and the solder layer 3.

The power module substrate 11 is provided with an insulating substrate 12, a circuit layer 13 disposed on a first face 12a of the insulating substrate 12 (upper face in FIG. 1), and a metal layer 14 disposed on a second face 12b of the insulating substrate 12 (lower face in FIG. 1).

The insulating substrate 12 is a substrate that prevents electrical connection between the circuit layer 13 and the metal layer 14, and is composed of ceramics having a high degree of insulation such as AlN (aluminum nitride), $Si_3N_4$ (silicon nitride), or $Al_2O_3$ (alumina).

In the embodiment, the insulating substrate 12 is composed of AlN (aluminum nitride).

In addition, in the embodiment, the thickness C of the insulating substrate 12 is 0.635 mm, which is within the range of 0.2 mm $\leq C \leq$ 1.5 mm.

The circuit layer 13 is formed by brazing a conductive metal plate 23 to the first face 12a of the insulating substrate 12.

In the embodiment, the circuit layer 13 is formed by brazing the metal plate 23 composed of aluminum having a purity of 99.99% or more (a so-called 4N aluminum) to the insulating substrate 12.

Here, in the embodiment, the brazing is performed by use of an Al—Si series brazing filler metal foil 26, Si of the brazing filler metal is diffused into the metal plate 23, and distribution of Si-concentration thereby occurs in the circuit layer 13.

The metal layer 14 is formed by brazing a metal plate 24 to the second face 12b of the insulating substrate 12.

In the embodiment, the metal layer 24 is formed by brazing the metal plate 24 composed of aluminum having a purity of 99.99% or more (a so-called 4N aluminum) to the insulating substrate 12, similarly to the circuit layer 13.

In the embodiment, the brazing is performed by use of an Al—Si series brazing filler metal foil 27, Si of the brazing filler metal is diffused into the metal plate 24, and distribution of Si-concentration thereby occurs in the metal layer 14.

Here, in the embodiment, the thickness A of the circuit layer 13 is 0.6 mm, which is within the range of 0.25 mm $\leq A \leq$ 0.9 mm.

In addition, in the embodiment, the thickness B of the metal layer 14 is 1.3 mm, which is within the range of 0.4 mm≤B≤5 mm.

Consequently, in the embodiment, the ratio B/A of the thickness B of the metal layer 14 to the thickness A of the circuit layer 13 is 1.3/0.6, that is 2.167, which is within the range of 1.5≤B/A≤20.

The heatsink 17 is a component cooling the above-described power module substrate 11, and is provided with a top panel portion 18 connected to the power module substrate 11 and a flow passage 19 in which a cooling medium (for example, cooling water) flows.

At least the top panel portion 18 is desirably composed of a material having excellent thermal conductivity in the heatsink 17, and is composed of aluminum material of A6063 in the embodiment.

In addition, in the embodiment, the thickness D of the top panel portion 18 is 1.7 mm, which is within the range of 1 mm≤D≤10 mm.

Consequently, the metal layer 14 of the power module substrate 11 is directly connected to the top panel portion 18 of the heatsink 17 by brazing.

In the embodiment, the brazing is performed by use of an Al—Si series brazing filler metal foil 28, Si of the brazing filler metal is diffused into the metal plate 24, and distribution of Si-concentration thereby occurs in the metal layer 14.

As described above, the metal layer 14 is brazed with the insulating substrate 12 by use of the brazing filler metal foil 27, and is brazed with the top panel portion 18 of the heatsink 17 by use of the brazing filler metal foil 28.

Figure 2:
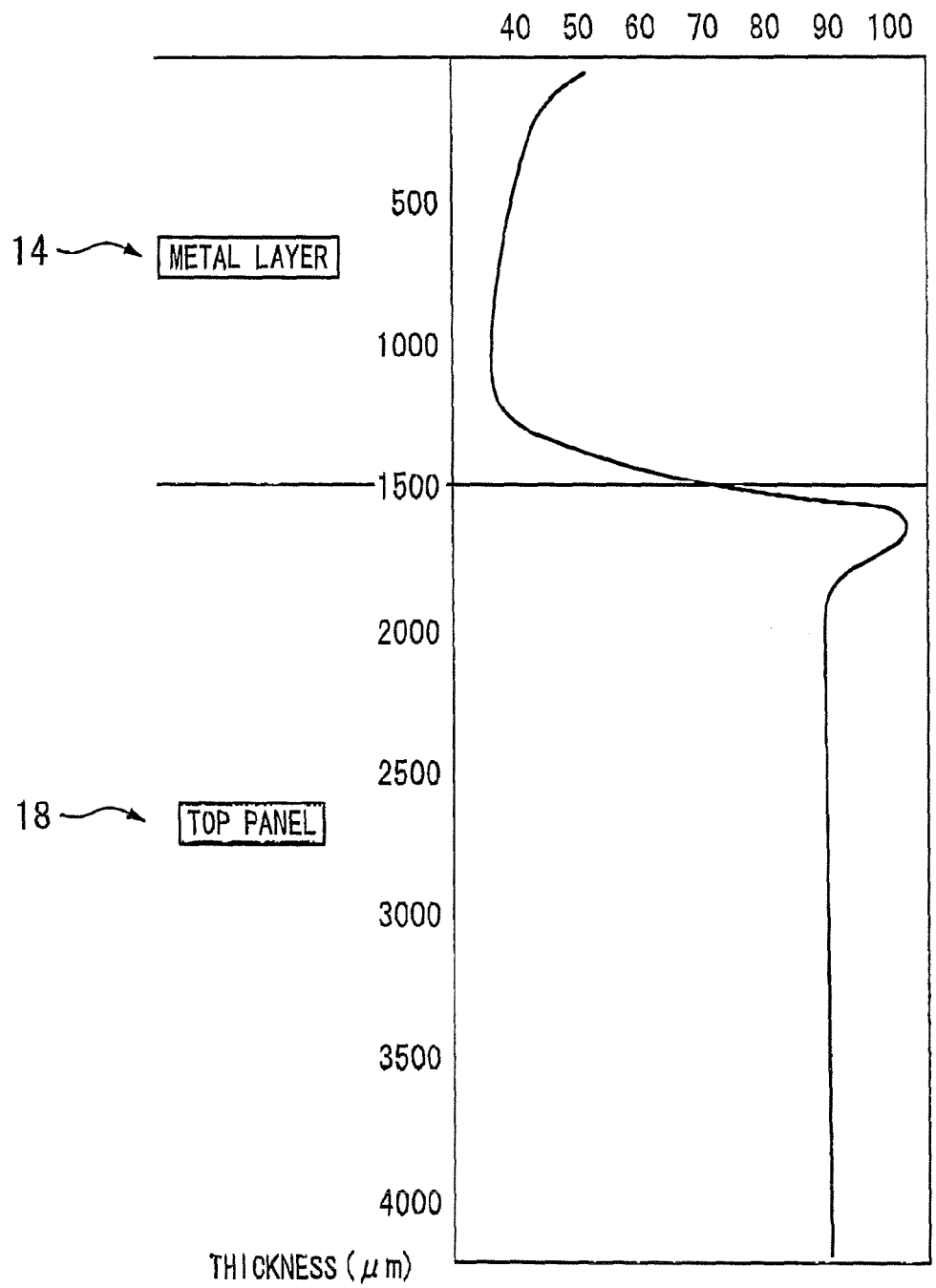
FIG. 2 is a view showing distribution of Vickers hardness of a metal layer and a top panel portion of the power module substrate having a heatsink of the embodiment of the present invention.

Because of this, as shown in FIG. 2, due to the distribution of Si-concentration, Vickers hardness varies in the metal layer 14 along the thickness direction thereof.

The foregoing power module substrate 10 having a heatsink is manufactured as described below.

As shown in FIG. 3A, firstly, an insulating substrate 12 composed of AlN is prepared.

Next, a circuit layer 13 that becomes a metal plate 23 (4N aluminum) is stacked on a first face 12a of the insulating substrate 12 in layers with a brazing filler metal foil 26 interposed therebetween.

The thickness of the brazing filler metal foil 26 is 0.02 mm.

In addition, a metal layer 14 that becomes a metal plate 24 (4N aluminum) is stacked on a second face 12b of the insulating substrate 12 in layers with brazing filler metal foil 27 interposed therebetween.

The thickness of the brazing filler metal foil 27 is the same as that of the brazing filler metal foil 26.

Subsequently, the layered body was formed in the above-described manner, the layered body is set inside of a vacuum furnace in a state where a pressure is applied to the layered body in the stacking direction thereof; and brazing is performed.

Therefore, a power module substrate 11 that is constituted of the insulating substrate 12, the circuit layer 13, and the metal layer 14 is formed (first connecting step S1).

Next, as shown in FIG. 3B, the top panel portion 18 of the heatsink 17 is stacked on the surface of the metal layer 14 of the power module substrate 11 in layers with a brazing filler metal foil 28 interposed therebetween.

The thickness of the brazing filler metal foil 28 is 0.05 mm.

A pressure is applied in the stacking direction in a state of being stacked as stated above and brazing is performed in the vacuum furnace, the power module substrate 10 having a heatsink of the embodiment is manufactured (second connecting step S2).

Here, in the second connecting step S2, the pressure of 0.15 to 3 MPa is applied to the power module substrate 11 and the heatsink 17 in the stacking direction.

In the power module substrate 10 having a heatsink and the power module 1 having a heatsink of the embodiment, which have the foregoing structure, the thickness of the metal layer 14 connected to the top panel portion 18 of the heatsink 17 is greater than the thickness of the circuit layer 13.

Consequently, even if the heatsink 17 in which the thickness of the top panel portion 18 is small is used, the total thickness of the metal layer 14 and the top panel portion 18 of the heatsink 17 which are positioned on the second face 12b of the insulating substrate 12 can be ensured, and it is possible to suppress the occurrence of warpage.

In addition, since the heatsink 17 in which the top panel portion 18 is thin is used, it is possible to improve the cooling efficiency, and it is possible to apply it to the power module in which electronic components having a high level of heat generation are packaged.

In addition, a relatively thick metal layer 14 is directly connected to the top panel portion 18 of the heatsink 17 by brazing and using the brazing filler metal foil 28.

Because of this, in the second connecting step S2 in which the power module substrate 11 is connected to the top panel portion 18 of the heatsink 17, it is possible to sufficiently deform the metal layer 14 when the pressure is applied to the power module substrate 11 and the heatsink 17 in the stacking direction thereof, and it is possible to reliably suppress warpage.

Furthermore, in the embodiment, the ratio B/A of the thickness B of the metal layer 14 to the thickness A of the circuit layer 13 is 1.3/0.6, that is, 2.167, which is within the range of 1.5≤B/A≤20.

Consequently, the thickness of the metal layer 14 is ensured, and it is possible to reliably obtain the effect that the above-described warpage is suppressed.

In addition, the metal layer 14 does not become a high degree of thermal resistance, it is possible to sufficiently cool the power module using the heatsink 17.

In addition, it is preferable that the ratio B/A of the thickness B of the metal layer 14 to the thickness A of the circuit layer 13 be in the range defined by 2.167≤B/A≤5.625.

In addition, the metal layer 14 is composed of aluminum having a purity of 99.99% or more, that is, a so-called 4N aluminum, before being connected.

For this reason, the deformation resistance of the metal layer 14 is small, it is possible to sufficiently deform the metal layer 14 when the pressure is applied in the stacking direction in the second connecting step S2 in which the metal layer 14 is connected to the top panel portion 18 of the heatsink 17, and it is possible to reliably suppress the occurrence of warpage.

In addition, in the second connecting step S2 in which the metal layer 14 is connected to the top panel portion 18 of the heatsink 17, since the power module substrate 11 and the heatsink 17 is pressed by applying the pressure of 0.15 to 3 MPa in the stacking direction, the metal layer 14 is reliably deformed, and it is possible to suppress warpage.

In addition, in the power module 1 having a heatsink of the embodiment, the semiconductor chip 2 is connected to the circuit layer 13 of the power module substrate 10 having a heatsink by use of the solder.

Therefore, since warpage deformation does not occur, it is possible to significantly improve the reliability, even if the usage environment is strict, for example, the usage environment where stress is repeatedly generated.

The embodiment of the present invention is described above, however, the present invention is not limited to the above embodiment, and various modifications may be made without departing from the scope of the invention.

For example, in the above-described embodiment, the case where AlN (aluminum nitride) is adopted as a material of the insulating substrate 12 is described, however, materials having an insulation property such as $Si_3N_4$ or $Al_2O_3$ may be adopted.

In addition, the structure in which the power module substrate 11 is connected to the top panel portion 18 formed in a tabular shape is described, however, the present invention is not limited to this structure.

Figure 4:
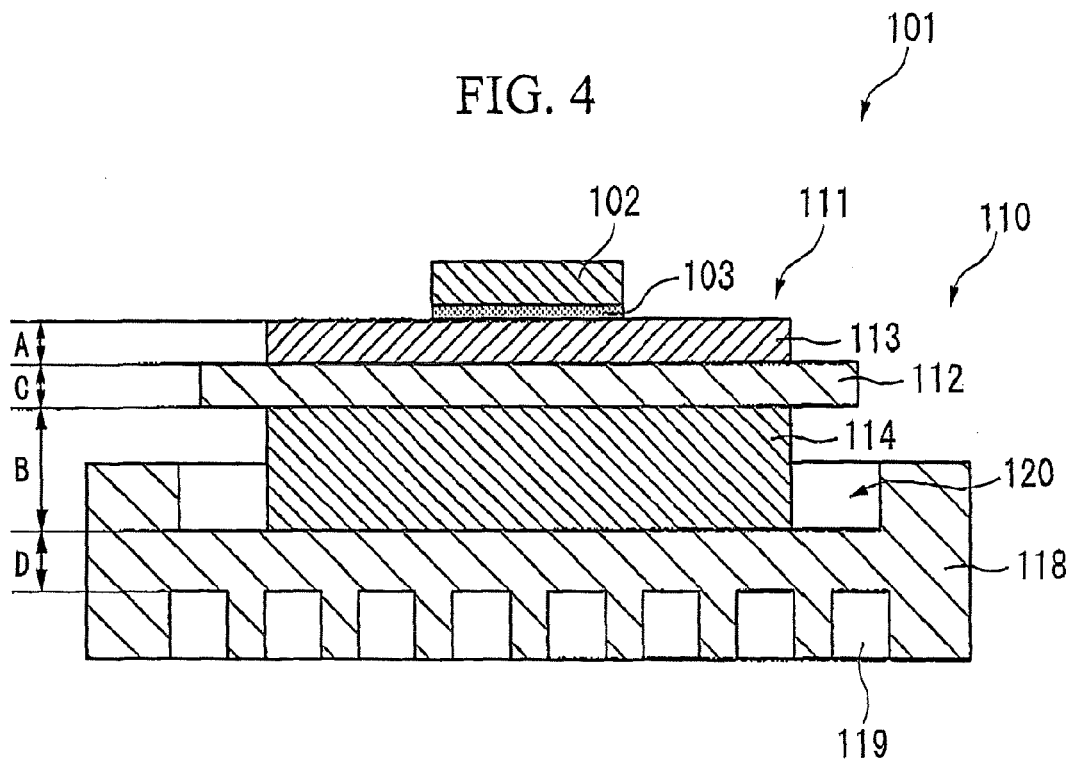
FIG. 4 is a schematic cross-sectional view showing the structure of a power module having a heatsink, in which a power module substrate having a heatsink of the other embodiment of the present invention is employed.

For example, as shown in FIG. 4, a recessed portion 120 may be formed on the top panel portion 118, and the power module substrate 111 may be contained in the recessed portion 120.

In this case, the thickness D of the top panel portion 118 is the thickness of the bottom face of the recessed portion 120.

Moreover, the structure in which the width of the metal layer 14 is the same as that of the circuit layer 13 and is narrower than that of the insulating substrate 12 is described in the above-described embodiment, however, the present invention is not limited to this structure.

For example, as shown in FIG. 5, the width of the metal layer 214 may be greater than the width of the circuit layer 213 or the insulating substrate 212.

In this case, alignment with a high level of precision is not necessary when the metal layer 214 is connected to the insulating substrate 212, it is possible to manufacture the power module substrate having a heatsink 210 in a relatively simple manner.

In addition, the structure in which the circuit layer and metal layer is composed of aluminum having a purity of 99.99% or more (4N aluminum) is described as an example, however, the present invention is not limited to this structure.

The circuit layer and the metal layer may be composed of high purity aluminum (aluminum with a purity of greater than or equal to 99%, 2N aluminum) or an aluminum alloy.

However, it is preferable that aluminum having a purity of 99.99% or more be used, because the deformation resistance of the metal layer become small and it is possible to reliably obtain the effect that warpage is suppressed.

Additionally, the structure in which the heatsink is composed of aluminum material of A6063 is described as an example, the present invention is not limited to this structure.

The heatsink may be composed of pure aluminum.

Furthermore, the heatsink having a flow passage of a cooling medium is described, however, the heatsink is not limited to a specific structure, for example, may be an air-cooled heatsink.

EXAMPLES

A comparison experiment will be described in order to evaluate effectivity of the present invention.

In the comparative examples 1 to 3 and the examples 1 to 5, common power module substrates having a heatsink were prepared, including an insulating substrate composed of AlN having a thickness of 0.635 mm, a circuit layer and a metal layer composed of 4N aluminum, and a heatsink provided with a top panel portion composed of aluminum material of A6063 having a thickness of 1.7 mm.

In addition, in the power module substrate having a heatsink, the metal layer was directly connected to the top panel portion of the heatsink by brazing.

Consequently, each of the thickness of the circuit layer and the thickness of the metal layer of the power module substrate having a heatsink was changed, and the power module substrates having a heatsink of the comparative examples 1 to 3 and the examples 1 to 5 were thereby manufactured.

In the examples, a state where warpage occurs in the manufactured power module substrate having a heatsink, and the thermal resistance between the heatsink and the insulating substrate are evaluated.

The comparative examples 1 to 3 were compared with the examples 1 to 5.

The evaluation result is shown in Table 1.

TABLE 1

| | COMPARATIVE EXAMPLE 1 | COMPARATIVE EXAMPLE 2 | EXAMPLE 1 | EXAMPLE 2 | EXAMPLE 3 | EXAMPLE 4 | EXAMPLE 5 | COMPARATIVE EXAMPLE 3 |
|---|---|---|---|---|---|---|---|---|
| THICKNESS A OF CIRCUIT LAYER | 0.6 mm | 0.6 mm | 0.6 mm | 0.6 mm | 0.4 mm | 0.4 mm | 0.25 mm | 0.4 mm |
| THICKNESS B OF METAL LAYER | 0.6 mm | 0.75 mm | 0.9 mm | 1.3 mm | 2.25 mm | 5 mm | 5 mm | 10 mm |
| B/A | 1 | 1.25 | 1.5 | 2.167 | 5.625 | 12.5 | 20 | 25 |
| WARPAGE DEFORMATION | X | Δ | ○ | ○ | ○ | ○ | ○ | ○ |
| THERMAL RESISTANCE | ○ | ○ | ○ | ○ | ○ | ○ | ○ | X |

In the comparative examples 1 and 2, since the metal layer is relatively thin, the thermal resistance thereof is small, however, warpage deformation is confirmed.

In contrast, as shown in the comparative example 3, in the case where the metal layer is significantly thick compared with the circuit layer, thermal resistance is high, and it is confirmed that cooling by the heatsink does not become sufficient.

In contrast, in the examples 1 to 5, it was found that warpage deformation was suppressed, and the thermal resistance was suppressed so as to be small.

As a result of comparison experiment, according to the present invention, it is confirmed that it is possible to provide the power module substrate having a heatsink in which warpage deformation does not occur and which is capable of effectively cooling electronic components or the like by the heatsink.

What is claimed is:

1. A power module substrate having a heatsink, comprising:
   a power module substrate having an insulating substrate composed of ceramics and having a first face and a second face, a circuit layer formed on the first face, and a metal layer formed on the second face; and
   a heatsink directly connected to the metal layer by brazing, cooling the power module substrate, wherein the metal layer is composed of aluminum having a purity of 99.99% or more before being connected to the heatsink, and a ratio B/A is in the range defined by 1.5≤B/A≤20, where a thickness of the circuit layer is represented as A, and a thickness of the metal layer is represented as B.

2. A power module having a heatsink, comprising:

the power module substrate having a heatsink according to claim 1; and an electronic component mounted on the circuit layer of the power module substrate having a heatsink.

3. The power module substrate having a heatsink according to claim 1, wherein the ratio B/A is in the range defined by 2.167≤B/A≤5.625.

4. The power module substrate having a heatsink according to claim 1, wherein the thickness A of the circuit layer is within the range of 0.25 mm≤A≤0.9 mm.

5. The power module substrate having a heatsink according to claim 1, wherein the thickness B of the metal layer is within the range of 0.4 mm≤B≤5 mm.

6. The power module substrate having a heatsink according to claim 1, wherein the thickness C of the insulating substrate is within the range of 0.2 mm≤C≤1.5 mm.

7. The power module substrate having a heatsink according to claim 1, wherein the heatsink is provided with a top panel portion connected to a surface of the metal layer and a flow passage in which a cooling medium flows.

8. The power module substrate having a heatsink according to claim 7, wherein the thickness D of the top panel portion is within the range of 0.1 mm≤D≤10 mm.

9. A method for manufacturing a power module substrate having a heatsink, comprising:

preparing an insulating substrate composed of ceramics and having a first face and a second face, and a heatsink;

connecting a circuit layer to the first face of the insulating substrate, and connecting a metal layer to the second face of the insulating substrate, thereby forming a power module substrate; and stacking the heatsink on the power module substrate in layers by brazing, and connecting the heatsink to the metal layer of the power module substrate by applying pressure of 0.15 to 3 MPa in a stacking direction wherein each of the circuit layer and the metal layer is formed by brazing a metal plate composed of aluminum, and the metal layer is composed of aluminum having a purity of 99.99% or more before being connected to the heatsink.

10. The power module substrate having a heatsink according to claim 9, wherein brazing is performed by use of an Al—Si series brazing filler metal foil.

11. A power module substrate comprising:

an insulating substrate composed of ceramics and having a first face and a second face;

a circuit layer formed on the first face; and a metal layer formed by brazing a metal plate composed of aluminum having a purity of 99.99% or more on the second face, wherein a ratio B/A is in the range defined by 1.5≤B/A≤20, where a thickness of the circuit layer is represented as A, and a thickness of the metal layer is represented as B.

12. The power module substrate according to claim 11, wherein the ratio B/A is in the range defined by 2.167≤B/A≤5.625.

* * * * *